US012796305B2

(12) United States Patent
Kim et al.

(10) Patent No.: US 12,796,305 B2
(45) Date of Patent: Nov. 10, 2026

(54) APPARATUS AND METHOD OF MANUFACTURING DISPLAY DEVICE

(71) Applicant: Samsung Display Co., Ltd., Yongin-si (KR)

(72) Inventors: Jeongkuk Kim, Yongin-si (KR); Hwi Kim, Yongin-si (KR); Seungyong Song, Yongin-si (KR); Areum Lee, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 448 days.

(21) Appl. No.: 18/469,590

(22) Filed: Sep. 19, 2023

(65) Prior Publication Data

US 2024/0107867 A1 Mar. 28, 2024

(30) Foreign Application Priority Data

Sep. 26, 2022 (KR) ........................ 10-2022-0121963

(51) Int. Cl.
*H10K 71/16* (2023.01)
*C23C 14/04* (2006.01)
*B05C 21/00* (2006.01)

(52) U.S. Cl.
CPC ......... *H10K 71/166* (2023.02); *C23C 14/042* (2013.01); *B05C 21/005* (2013.01)

(58) Field of Classification Search
CPC ..... C23C 14/04; C23C 14/042; B05C 21/005; H10K 71/166; H10K 71/00; H10K 50/00; H10K 59/00
USPC ............................ 204/298.11; 118/720, 721
See application file for complete search history.

(56) References Cited

U.S. PATENT DOCUMENTS

2020/0083451 A1 3/2020 Ha et al.
2022/0181595 A1 6/2022 Kim

FOREIGN PATENT DOCUMENTS

CN 108893710 A 11/2018
CN 112626452 4/2021
CN 114054925 2/2022
KR 10-0982021 9/2010
KR 10-2018-0038093 4/2018
KR 10-1986333 6/2019
(Continued)

OTHER PUBLICATIONS

Machine Translation KR 10-2018-0038093 (Year: 2018).*

*Primary Examiner* — Rodney G McDonald
(74) *Attorney, Agent, or Firm* — CANTOR COLBURN LLP

(57) ABSTRACT

Disclosed is an apparatus and method of manufacturing a display device. The apparatus includes a deposition source, and a mask assembly disposed between a substrate and the deposition source, the mask assembly includes a mask frame having an opening area, a first support frame disposed across the opening area in a first direction, and having both ends disposed on the mask frame, and a second support frame disposed across the opening area in a second direction, and having both ends disposed on the mask frame, the first support frame and the second support frame intersect each other, one of the first support frame and the second support frame includes an accommodation portion, and the other of the first support frame and the second support frame is inserted into the accommodation portion.

18 Claims, 9 Drawing Sheets

(56) References Cited

FOREIGN PATENT DOCUMENTS

| | | | |
|---|---|---|---|
| KR | 101999360 | B1 | 7/2019 |
| KR | 20200030712 | A | 3/2020 |
| KR | 10-2083947 | | 4/2020 |
| KR | 20220048499 | A | 4/2022 |
| KR | 102427523 | B1 | 7/2022 |

* cited by examiner

APPARATUS AND METHOD OF MANUFACTURING DISPLAY DEVICE

CROSS-REFERENCE TO RELATED APPLICATION(S)

This application claims priority to and benefits of Korean Patent Application No. 10-2022-0121963 under 35 U.S.C. § 119, filed on Sep. 26, 2022, in the Korean Intellectual Property Office, the entire contents of which are incorporated herein by reference.

BACKGROUND

1. Technical Field

One or more embodiments relate to a method and apparatus, and, to an apparatus and method of manufacturing a display device.

2. Description of the Related Art

Mobility-based electronic apparatuses have been widely used.

Recently, as electronic apparatuses, tablet personal computers (PCs) are widely used in addition to compact electronic apparatuses such as mobile phones.

A mobile electronic apparatus may include a display device to provide a user with visual information, such as images or videos, to support various functions.

With a recent trend of miniaturization of components to drive a display device, the portion occupied by display devices in electronic apparatuses gradually increases, and a structure in which a display device in a flat state is bendable by a certain angle has been developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

A display device may include a common layer disposed on a substrate.

The common layer may be disposed entirely on a display area.

A mask assembly used to form the common layer may be manufactured by various methods.

An area where the common layer is formed according to the structure of a mask assembly and a manufacturing method may be similar to the display area within the spirit and the scope of the disclosure.

One or more embodiments include an apparatus and method of manufacturing a display device, by which, while reducing deformation, a deposition area is similar to a display area within the spirit and the scope of the disclosure.

Additional aspects will be set forth in part in the description which follows and, in part, will be apparent from the description, or may be learned by practice of embodiments of the disclosure.

According to one or more embodiments, an apparatus for manufacturing a display device may include a deposition source; and a mask assembly disposed between a substrate and the deposition source, wherein the mask assembly may include a mask frame having an opening area; a first support frame disposed across the opening area in a first direction, and having both ends disposed on the mask frame; and a second support frame disposed across the opening area in a second direction, and having both ends disposed on the mask frame, the first support frame and the second support frame intersect each other, one of the first support frame and the second support frame comprises an accommodation portion, and the other of the first support frame and the second support frame is inserted into the accommodation portion.

In an embodiment, a surface of the first support frame and a surface of the second support frame, both facing the substrate, may be disposed on a flat surface.

In an embodiment, the other of the first support frame and the second support frame inserted into the accommodation portion may include a welding recess.

In an embodiment, the accommodation portion may include a first accommodation portion; and a second accommodation portion, the second accommodation portion disposed below the first accommodation portion, and having a width less than a width of the first accommodation portion.

In an embodiment, the other of the first support frame and the second support frame inserted into the accommodation portion may be attached to the one of the first support frame and the second support frame between the first accommodation portion and the second accommodation portion.

In an embodiment, a side surface of the other of the first support frame and the second support frame inserted into the accommodation portion may have a substantially step shape.

In an embodiment, the one of the first support frame and the second support frame may include a through portion disposed in the one of the first support frame and the second support frame to be connected to the accommodation portion.

In an embodiment, a welding point for attaching the first support frame and the second support frame may be disposed in the through portion.

In an embodiment, a cross-section of at least one of the first support frame and the second support frame may have a substantially trapezoidal shape, and the cross-section of the at least one of the first support frame and the second support frame is perpendicular to a longitudinal direction.

In an embodiment, an upper surface of the mask frame may have a substantially step shape.

According to one or more embodiments, a method of manufacturing a display device may include disposing a substrate and a mask assembly; and depositing a deposition material on the substrate by passing the deposition material through the mask assembly, wherein the mask assembly may include a mask frame having an opening area; a first support frame disposed across the opening area in a first direction, and having both ends disposed on the mask frame; and a second support frame disposed across the opening area in a second direction, and having both ends disposed on the mask frame; the first support frame and the second support frame intersect each other, one of the first support frame and the second support frame may include an accommodation portion, and the other of the first support frame and the second support frame is inserted into the accommodation portion.

In an embodiment, a surface of the first support frame and a surface of the second support frame, both facing the substrate, may be disposed on a flat surface.

In an embodiment, the other of the first support frame and the second support frame inserted into the accommodation portion may include a welding recess.

In an embodiment, the accommodation portion may include a first accommodation portion; and a second accommodation portion disposed below the first accommodation portion, and having a width less than a width of the first accommodation portion.

In an embodiment, the other of the first support frame and the second support frame inserted into the accommodation portion may be attached to the one of the first support frame and the second support frame between the first accommodation portion and the second accommodation portion.

In an embodiment, a side surface of the other of the first support frame and the second support frame inserted into the accommodation portion may have a substantially step shape.

In an embodiment, the one of the first support frame and the second support frame may include a through portion disposed in the one of the first support frame and the second support frame to be connected to the accommodation portion.

In an embodiment, a welding point for attaching the first support frame and the second support frame may be disposed in the through portion.

In an embodiment, a cross-section of at least one of the first support frame and the second support frame may have a substantially trapezoidal shape, and the cross-section of the at least one of the first support frame and the second support frame is perpendicular to a longitudinal direction.

In an embodiment, an upper surface of the mask frame may have a substantially step shape.

Other aspects, features, and advantages than those described above will become apparent from the following drawings, claims, and detailed description of the disclosure These general and various embodiments may be implemented by using a system, a method, a computer program, or a combination thereof.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
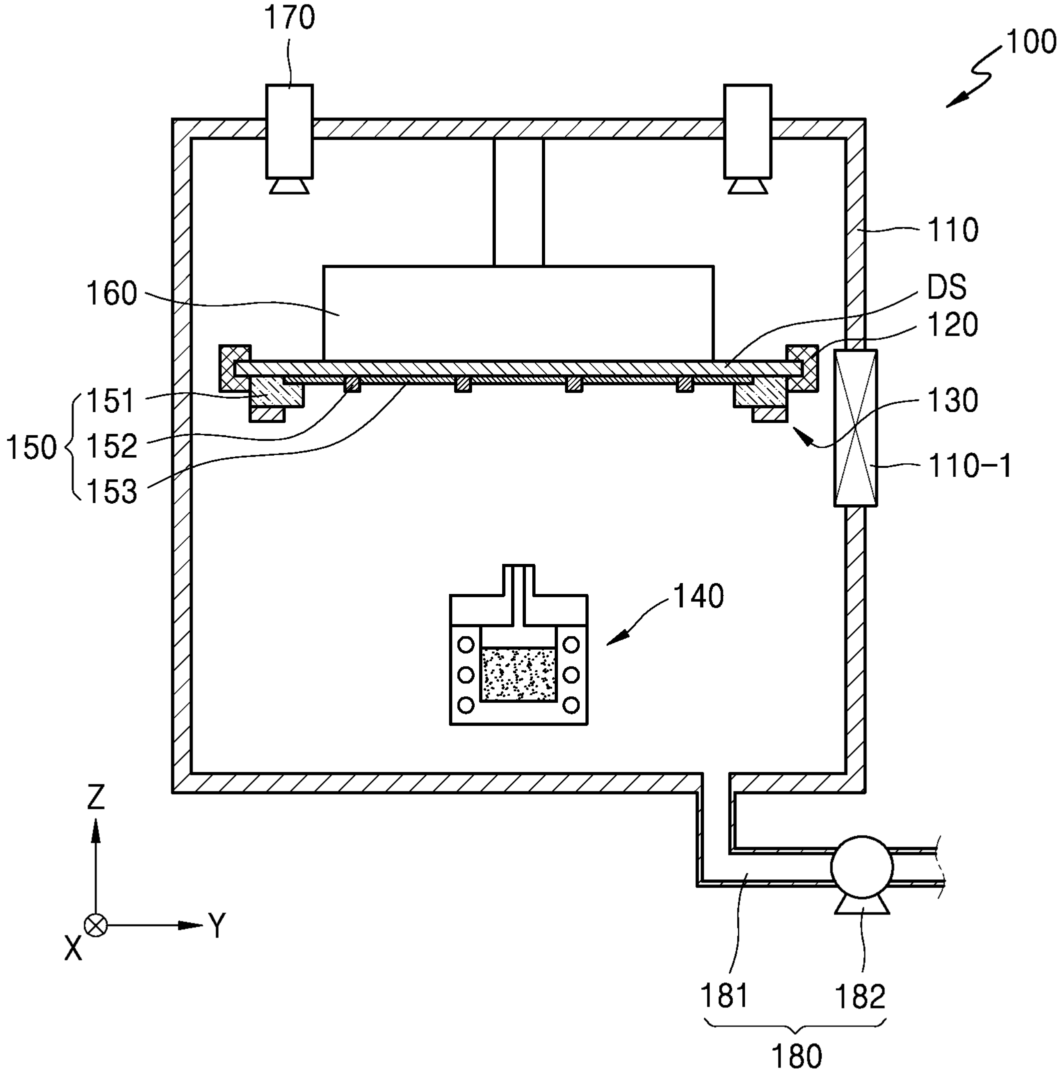
FIG. 1 is a schematic cross-sectional view of an apparatus for manufacturing a display device, according to one or more embodiments.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this regard, embodiments may have different forms and should not be construed as being limited to the descriptions set forth herein.

Accordingly, the embodiments are described below, by referring to the figures, to explain aspects of the description.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Throughout the disclosure, the expression "at least one of a, b and c" indicates only a, only b, only c, both a and b, both a and c, both b and c, all of a, b, and c, or variations thereof.

Various modifications may be applied to the embodiments, and various embodiments will be illustrated in the drawings and described in the detailed description section.

The effect and features of the embodiments, and a method to achieve the same, will be clearer referring to the detailed descriptions below with the drawings.

However, the embodiments may be implemented in various forms, not by being limited to the embodiments presented below.

Hereinafter, embodiments will be described, in detail, with reference to the accompanying drawings, and in the description with reference to the drawings, the same or corresponding constituents are indicated by the same reference numerals and redundant descriptions thereof may be omitted. In the drawings, sizes, thicknesses, ratios, and dimensions of the elements may be exaggerated for ease of description and for clarity. Like reference numerals refer to like elements throughout.

It will be understood that although the terms "first," "second," etc. may be used herein to describe various components, these components should not be limited by these terms. These terms are only used to distinguish one component from another. For example, a first element may be referred to as a second element, and similarly, a second element may be referred to as a first element without departing from the scope of the disclosure.

As used herein, the singular forms "a," "an" and "the" are intended to include the plural forms as well, unless the context clearly indicates otherwise.

It will be further understood that the terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when a layer, region, or component is referred to as being "formed on" another layer, region, or component, it can be directly or indirectly formed on the other layer, region, or component. For example, intervening layers, regions, or components may be present.

It will be understood that when an element (or a region, a layer, a portion, or the like) is referred to as "being on", "connected to" or "coupled to" another element in the specification, it can be directly disposed on, connected or coupled to the another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include lamination, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

Sizes of components in the drawings may be exaggerated for convenience of explanation.

In other words, since sizes and thicknesses of components in the drawings may be arbitrarily illustrated for convenience of explanation, the following embodiments are not limited thereto.

In the following examples, the X-axis direction, the Y-axis direction and the Z-axis direction are not limited to three axes of the rectangular coordinate system, and may be interpreted in a broader sense.

For example, the X-axis direction, the Y-axis direction, and the Z-axis direction may be perpendicular to one another, or may represent different directions that are not perpendicular to one another.

When an embodiment may be implemented differently, a selected process order may be performed differently from the described order.

For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, or 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of an apparatus for manufacturing a display device, according to one or more embodiments.

Referring to FIG. 1, the apparatus 100 for manufacturing a display device (or the apparatus 100 of manufacturing a display device) may include a chamber 110, a first support portion 120, a second support portion 130, a mask assembly 150, a source unit 140, a magnetic force unit 160, a vision unit 170, and a pressure regulator 180.

The chamber 110 may have a space formed therein, and the space may have a partially open portion.

A gate valve 110-1 may be formed in an open portion of the chamber 110.

The open portion of the chamber 110 may be opened or closed depending on the operation of the gate valve 110-1.

The first support portion 120 may support a display substrate DS by placing the same thereon.

The first support portion 120 may have the shape of a plate fixed in the chamber 110.

In an embodiment, the display substrate DS is placed on the first support portion 120, which may be in the form of a shuttle capable of linear motion in the chamber 110.

In an embodiment, the first support portion 120 may include an electrostatic chuck or adhesive chuck arranged or disposed in the chamber 110 to be fixed in the chamber 110 or to be capable of elevating in the chamber 110.

In the following description, for convenience of explanation, a case in which the first support portion 120 has the shape of a plate fixed in the chamber 110 is described in detail.

The mask assembly 150 may be placed on the second support portion 130.

The second support portion 130 may be disposed in the chamber 110.

The second support portion 130 may be capable of fine adjustment of the position of the mask assembly 150.

The second support portion 130 may include a separate driver, an alignment unit, or the like to allow the mask assembly 150 to be movable in different directions.

In an embodiment, the second support portion 130 may be in the form of a shuttle.

The mask assembly 150 is placed on the second support portion 130, and the second support portion 130 may transfer the mask assembly 150.

For example, the second support portion 130 may move out of the chamber 110, have the mask assembly 150 placed thereon, and enter the chamber 110 from the outside of the chamber 110.

In the above case, the first support portion 120 and the second support portion 130 may be integral with each other.

The first support portion 120 and the second support portion 130 may each include a movable shuttle.

The first support portion 120 and the second support portion 130 may each have a structure to fix the mask assembly 150 and the display substrate DS while the display substrate DS is placed on the mask assembly 150, and may be capable of linearly moving the display substrate DS and the mask assembly 150 simultaneously.

In an embodiment, the first support portion 120 and the second support portion 130 may be disposed to respectively surround the side surface of the display substrate DS and the side surface of the mask assembly 150 to be capable of linearly moving the display substrate DS and the mask assembly 150.

However, in the following description, for convenience of explanation, a case in which the first support portion 120 and the second support portion 130 are formed in the chamber 110 to be distinguishable from each other at different positions is described in detail.

The source unit 140 may be disposed to face the mask assembly 150.

The source unit 140 may accommodate a deposition material, and by applying heat to the deposition material, the deposition material may be vaporized or sublimated.

The source unit 140 may be fixed in the chamber 110 or disposed in the chamber 110 to be capable of linear motion in one direction or a direction.

However, in the following description, for convenience of explanation, a case in which the source unit 140 is fixed in the chamber 110 is described in detail.

The mask assembly 150 may include a mask frame 151, a first support frame 152 and a second support frame 153.

The magnetic force unit 160 may be disposed in the chamber 110 to face the display substrate DS.

The magnetic force unit 160 may apply a magnetic force to at least one of the first support frame 152 and the second support frame 153 to allow the mask assembly 150 to be in close contact with the display substrate DS.

For example, the magnetic force unit 160 may allow the mask assembly 150 to be in close contact with the display substrate DS within the spirit and the scope of the disclosure.

The vision unit 170 may be provided in the chamber 110, and may capture the positions of the display substrate DS and the mask assembly 150.

The vision unit 170 may include a camera to capture the positions of the display substrate DS and the mask assembly 150.

The positions of the display substrate DS and the mask assembly 150 may be identified based on an image captured by the vision unit 170, and based on the image, the position of the display substrate DS on the first support portion 120 may be finely adjusted or the position of the mask assembly 150 on the second support portion 130 may be finely adjusted.

However, in the following description, a case in which the positions of the display substrate DS and the mask assembly 150 are aligned with each other by finely adjusting the position of the mask assembly 150 on the second support portion 130 is described in detail.

The pressure regulator 180 may be connected to the chamber 110 to regulate the pressure in the chamber 110.

For example, the pressure regulator 180 may regulate the pressure in the chamber 110 to be the same as or similar to the atmospheric pressure.

Furthermore, the pressure regulator 180 may regulate the pressure in the chamber 110 to be the same as or similar to a vacuum state.

The pressure regulator 180 may include a connecting pipe 181 connected to the chamber 110 and a pump 182 provided on the connecting pipe 181.

According to the operation of the pump 182, external air may be introduced into the chamber 110 through the connecting pipe 181 or a gas in the chamber 110 may be guided to the outside though the connecting pipe 181.

The apparatus 100 for manufacturing a display device as described above, may be used to manufacture a display device (not shown) to be described below.

In detail, in case that the pressure regulator 180 makes the inside of the chamber 110 to be a state that is the same as or similar to the atmospheric pressure, the gate valve 110-1 is operated to open the open portion of the chamber 110.

The display substrate DS outside the chamber 110 may be loaded into the chamber 110.

The display substrate DS may be loaded into the chamber 110 in various methods.

For example, the display substrate DS may be loaded into the chamber 110 from the outside thereof through a robot arm and the like disposed outside the chamber 110.

In an embodiment, in case that the first support portion 120 is formed in the form of a shuttle, after the first support portion 120 in the chamber 110 is carried out of the chamber 110, the display substrate DS may be placed on the first support portion 120 through a separate robot arm and the like disposed outside the chamber 110 and the first support portion 120 may be loaded from the outside of the chamber 110 into the chamber 110.

In the following description, for convenience of explanation, a case in which the display substrate DS is loaded from the outside of the chamber 110 into the chamber 110 through a robot arm disposed outside the chamber 110 is described in detail.

The display substrate DS, as described above, may have various shapes.

Figure 11:
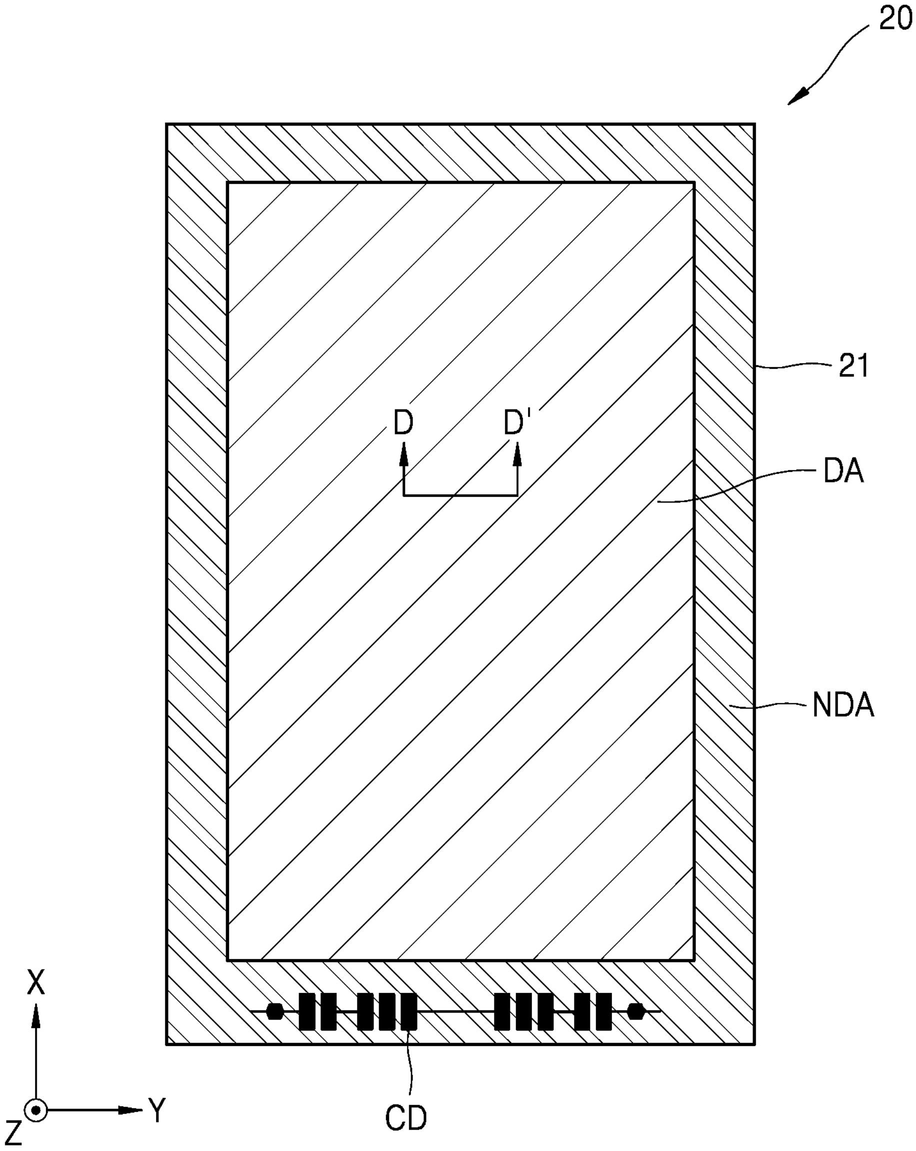
FIG. 11 is a schematic plan view of a display device according to one or more embodiments.

For example, the display substrate DS may have a shape in which layers are disposed in areas on a mother substrate (not shown) in which substrates (not shown) to be described below in FIG. 11 are connected to each other.

The areas may be disposed to be separated from each other on the mother substrate.

Each area may be one display area DA illustrated in FIG. 11.

The mask assembly 150 is disposed in the chamber 110 as described above.

In an embodiment, the mask assembly 150 may be loaded from the outside of the chamber 110 into the chamber 110 in the same or similar manner to the display substrate DS.

However, in the following description, for convenience of explanation, a case in which, while the mask assembly 150 is disposed in the chamber 110, only the display substrate DS is loaded from the outside of the chamber 110 into the chamber 110 is described in detail.

In the above case, in an embodiment, as described above, after the first support portion 120 and the second support portion 130, each being in the form of a shuttle, fix the display substrate DS and the mask assembly 150, respectively, the display substrate DS and the mask assembly 150 may be loaded from the outside of the chamber 110 into the chamber 110.

In case that the display substrate DS is loaded into the chamber 110, the display substrate DS may be placed on the first support portion 120.

The vision unit 170 may capture the positions of the display substrate DS and the mask assembly 150.

For example, the vision unit 170 may capture a first alignment mark of the display substrate DS and a second alignment mark of the mask assembly 150.

The positions of the display substrate DS and the mask assembly 150 may be identified based on the first alignment mark and the second alignment mark captured as described above.

The apparatus 100 for manufacturing a display device may include a separate controller (not shown) to identify the positions of the display substrate DS and the mask assembly 150.

In case that the identification of the positions of the display substrate DS and the mask assembly 150 is completed, the second support portion 130 may finely adjust the position of the mask assembly 150.

The source unit 140 may be operated to supply a deposition material toward the mask assembly 150, and the deposition material having passed through an opening portion TA (see FIG. 2) may be deposited on the display substrate DS.

The pump 182 sucks the gas in the chamber 110 to be discharged to the outside so that the pressure in the chamber 110 may maintain in a state that is the same as or similar to a vacuum state.

In the above case, the deposition material may be deposited on the display substrate DS.

The deposition material may be deposited in each area of the display substrate DS.

The above task may be repeatedly performed on the display substrates DS.

In case that the number of depositions on the display substrates DS reaches a preset number, the operation of the apparatus 100 for manufacturing a display device may be stopped, and the mask assembly 150 may be led out to the outside of the chamber 110.

As the mask assembly 150 may be in a state of being deposited with the deposition material used in the deposition, the mask assembly 150 may be cleaned by spraying a cleaning solution toward the mask assembly 150. Accordingly, the apparatus 100 for manufacturing a display device may deposit the deposition material in an area that is the same as or similar to the shape designed on the display substrate DS.

Furthermore, as the apparatus 100 for manufacturing a display device is capable of depositing a deposition material in a precise pattern, a display device capable of implementation of a precise image may be manufactured.

Figure 2:
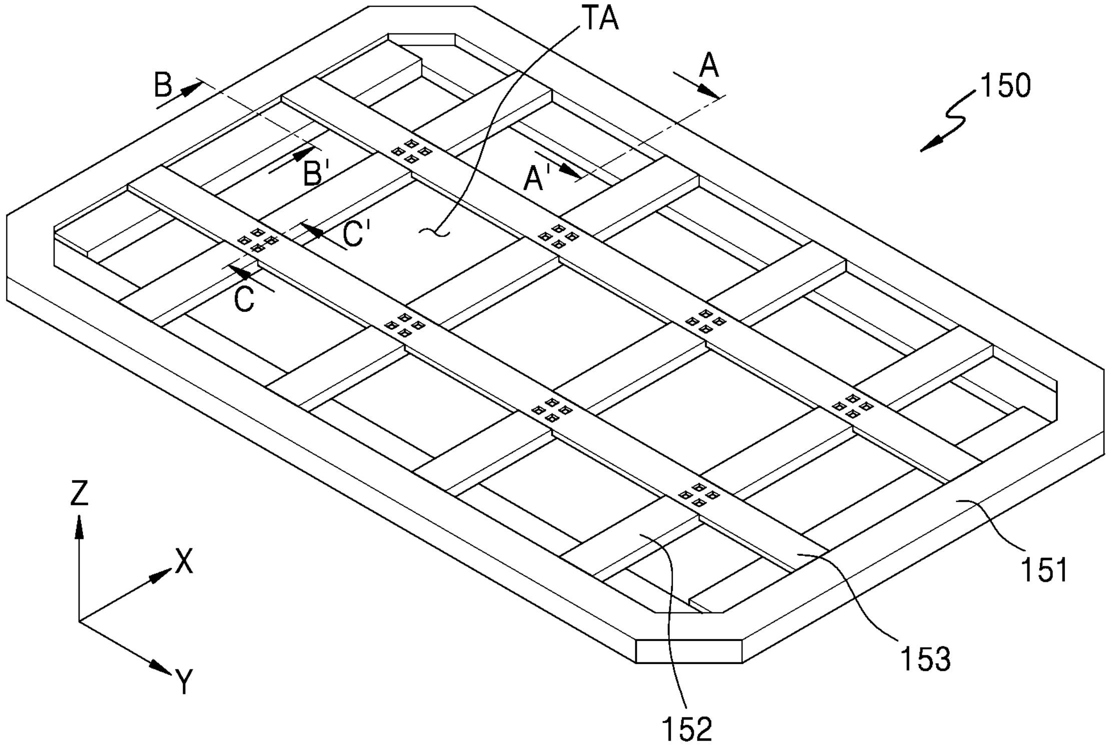
FIG. 2 is a schematic perspective view of the mask assembly illustrated in FIG. 1.

FIG. 2 is a schematic perspective view of the mask assembly illustrated in FIG. 1.

Figure 3:
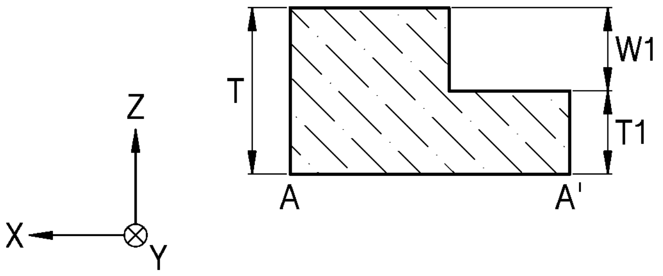
FIG. 3 is a schematic cross-sectional view of the mask frame taken along line A-A' of FIG. 2.

FIG. 3 is a schematic cross-sectional view of the mask frame taken along line A-A' of FIG. 2.

Figure 4:
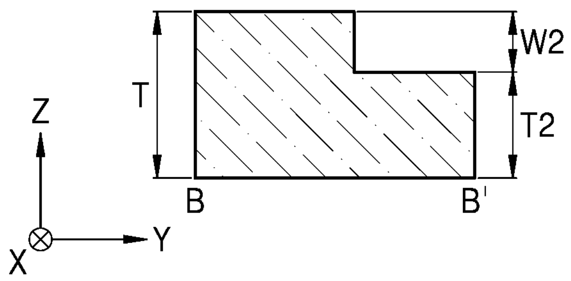
FIG. 4 is a schematic cross-sectional view of the mask frame taken along line B-B' of FIG. 2.

FIG. 4 is a schematic cross-sectional view of the mask frame taken along line B-B' of FIG. 2.

Figure 5:
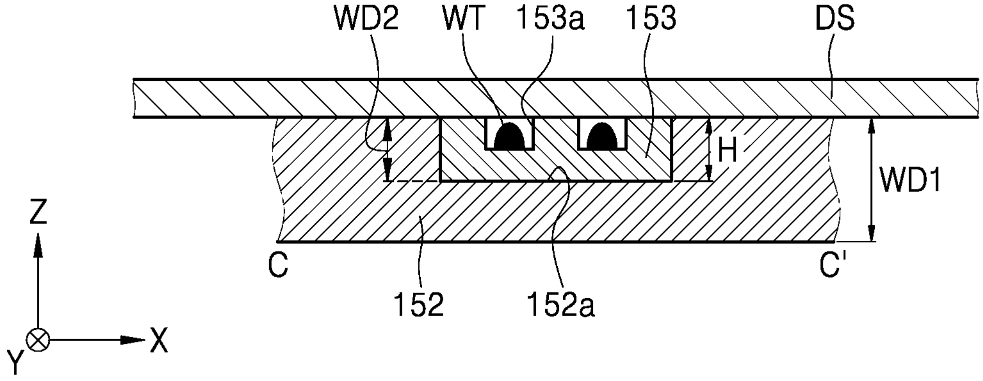
FIG. 5 is a schematic cross-sectional view of the mask assembly taken along line C-C' of FIG. 2.

FIG. 5 is a schematic cross-sectional view of the mask assembly taken along line C-C' of FIG. 2.

Referring to FIGS. 2 to 5, the mask assembly 150 may include the mask frame 151, the first support frame 152, and the second support frame 153.

The mask frame 151 may include one opening area (not shown).

The edges of the mask frame 151 may be formed to have a step such that the first support frame 152 and the second support frame 153 are respectively placed thereon.

For example, a long side portion of the mask frame 151, on which the first support frame 152 is placed, may be formed to have a step.

In detail, the mask frame 151 may include a portion having an overall thickness T of the mask frame 151 and a portion having a first placement thickness T1.

The overall thickness T may be greater than the first placement thickness T1.

A short side portion of the mask frame 151, on which the second support frame 153 is placed, may be formed to have a step.

In detail, the mask frame 151 may include a portion having the overall thickness T and a portion having a second placement thickness T2.

In the above case, the first placement thickness T1 and the second placement thickness T2 may be different from each other.

The first placement thickness T1 may be less than the second placement thickness T2.

Furthermore, a first distance W1 from the portion having the overall thickness T to the portion having the first placement thickness T1 may be substantially the same as a first thickness WD1 of the first support frame 152, and a second distance W2 from the portion having the overall thickness T to the portion having the second placement thickness T2 may be substantially the same as a second thickness WD2 of the second support frame 153.

The first support frame 152 and the second support frame 153 may each be in the form of a sheet, and may be arranged or disposed to intersect the opening area.

For example, the first support frame 152 may be formed to extend in a first direction, for example, an X-axis direction of FIG. 2, and the second support frame 153 may extend in a second direction, for example, a Y-axis direction of FIG. 2. FIG. 2, for example, may also include a third direction such as a Z-axis direction.

The first support frame 152 and the second support frame 153 may be arranged or disposed to intersect each other.

For example, the first support frame 152 and the second support frame 153 may perpendicularly intersect each other.

The first support frame 152 and the second support frame 153 described above may divide the opening area into opening portions TA.

One opening portion TA may form one deposition area, and the deposition area may correspond to a display area (e.g., the display device DA of FIG. 11) of one display device to be described below.

In the above case, the mask assembly 150 of FIG. 2 may simultaneously form display areas.

One of the first support frame 152 and the second support frame 153, as described above, may be disposed above the other of the first support frame 152 and the second support frame 153.

For example, the first support frame 152 may be disposed above the second support frame 153.

In an embodiment, the first support frame 152 may be disposed below the second support frame 153.

In the following description, for convenience of explanation, a case in which the first support frame 152 is disposed below the second support frame 153 is described in detail.

In the above case, the first thickness WD1 of the first support frame 152 and the second thickness WD2 of the second support frame 153 may be different from each other.

The thickness of one of the first support frame 152 and the second support frame 153 disposed above may be less than the thickness of the other of the first support frame 152 and the second support frame 153 disposed below.

For example, with reference to FIG. 2, the first thickness WD1 may be greater than the second thickness WD2.

In the above case, the first support frame 152 may include an accommodation portion 152*a* into which the second support frame 153 is inserted and placed.

The accommodation portion 152*a* may be led in from one surface or a surface of the first support frame 152.

For example, the accommodation portion 152*a* may be in the form of a groove.

A depth H of the accommodation portion 152*a* may be greater than or equal to the second thickness WD2.

In other words, a bottom surface of the accommodation portion 152*a* may be in contact with one surface or a surface of the second support frame 153 or separated from one surface or a surface of the second support frame 153.

The other surface, for example, an upper surface, of the second support frame 153 and one surface or a surface, for example, an upper surface, of the first support frame 152 may form one flat surface.

One surface or a surface, for example, an upper surface, of a protruding portion of the mask frame 151, the other surface or another surface, for example, an upper surface, of the second support frame 153, and one surface, for example, an upper surface, of the first support frame 152 may form one flat surface or a flat surface.

The accommodation portion 152*a*, as described above, may be disposed at intersections where the first support frame 152 and the second support frame 153 intersect each other.

As such, one surface or a surface of the first support frame 152 and the other surface of the second support frame 153 may form one flat surface or a flat surface.

A welding recess 153*a* may be provided in the second support frame 153.

The welding recess 153*a* may be disposed at the intersections where the first support frame 152 and the second support frame 153 intersect each other.

The welding recess 153*a* may include welding recesses.

The welding recesses 153*a* may be disposed spaced apart from each other.

The welding recess 153*a* and the accommodation portion 152*a* may be formed in various methods.

For example, the welding recess 153*a* and the accommodation portion 152*a* may be formed by laser.

By a separate laser irradiation portion, the accommodation portion 152*a* may be formed in the first support frame 152, and the welding recess 153*a* may be formed in the second support frame 153.

Accordingly, as the bottom surface of the accommodation portion 152*a* and a bottom surface of the welding recess 153*a* are uniformly processed, even in case that the second support frame 153 is placed on a bottom surface of the accommodation portion 152*a*, the second support frame 153 is not deformed, and during the formation of a welding point WT, the deterioration of a bonding force between the first support frame 152 and the second support frame 153 may be prevented.

The welding point WT may be disposed in the welding recess 153*a* as described above.

As the welding point WT is disposed in the welding recess 153*a*, the first support frame 152 and the second support frame 153 may be connected to each other.

The welding point WT may be formed through laser welding or arc welding.

In the above case, as the welding point WT is prevented from protruding from an outer surface of the second support frame 153, the damage of the display substrate DS by the welding point WT may be prevented.

Furthermore, as the second support frame 153 is inserted into the accommodation portion 152*a*, during the deposition process, even in case that heat is applied to the second support frame 153, the deformation of the second support frame 153 may be prevented.

Figure 6A:
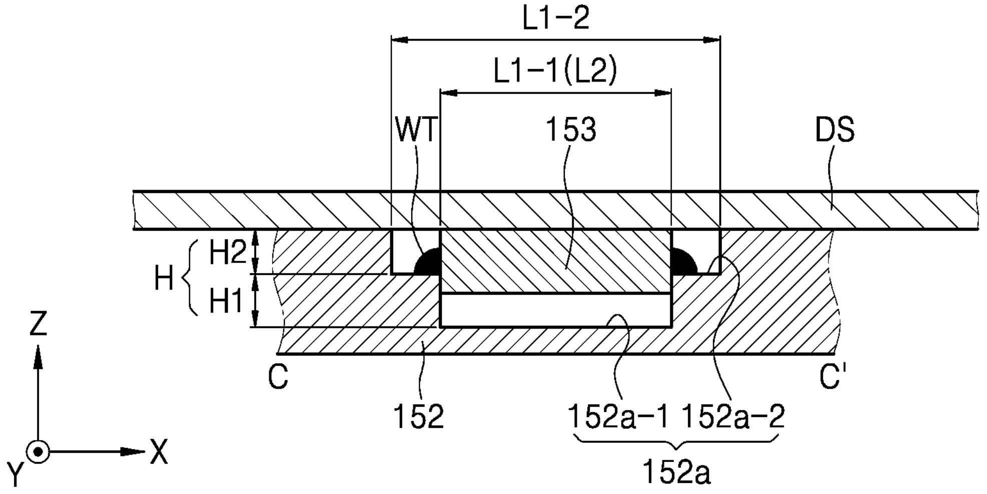
FIG. 6A is a schematic cross-sectional view of a portion of a mask assembly of an apparatus for manufacturing a display device, according to an embodiment.

FIG. 6A is a schematic cross-sectional view of a portion of a mask assembly of an apparatus for manufacturing a display device, according to an embodiment.

Line C-C' may denote a cross-sectional line for the same portion that is indicated by line C-C' of FIG. 2.

Referring to FIG. 6A, an apparatus (not shown) for manufacturing a display device may include a chamber (not shown), a first support portion (not shown), a second support portion (not shown), the mask assembly 150 (e.g., see FIG. 2), a source unit (not shown), a magnetic force unit (not shown), a vision unit (not shown), and a pressure regulator (not shown).

As the chamber, the first support portion, the second support portion, the source unit, the magnetic force unit, the vision unit, and the pressure regulator are the same as or similar to those described in FIG. 1, detailed descriptions thereof are omitted.

The mask assembly 150 may include a mask frame (not shown), the first support frame 152, and the second support frame 153.

As the mask frame, the first support frame 152, and the second support frame 153 are similar to those illustrated in FIG. 2, detailed descriptions thereof are omitted.

While one of the first support frame 152 and the second support frame 153 may include the accommodation portion 152*a*, the other of the first support frame 152 and the second support frame 153 may be inserted into the accommodation portion 152*a*.

In the following description, for convenience of explanation, a case in which the first support frame 152 may include the accommodation portion 152*a* is described in detail.

The accommodation portion 152*a* may include a first accommodation portion 152*a*-1 and a second accommodation portion 152*a*-2 having different sizes.

For example, a first accommodation portion width L1-1 of the first accommodation portion 152*a*-1 may be less than a second accommodation portion width L1-2 of the second accommodation portion 152*a*-2.

The first accommodation portion width L1-1 may be substantially the same as a second support frame width L2 of the second support frame 153 in the first direction (e.g., X-axis direction).

Furthermore, the second accommodation portion width L1-2 may be greater than the second support frame width L2.

The side surface of the second support frame 153 is formed to be separated from an inner surface of the second accommodation portion 152*a*-2, thereby providing a space for performing welding.

In the above case, a first accommodation portion depth H1 of the first accommodation portion 152*a*-1 may be less than the second thickness WD2 of the second support frame 153.

Furthermore, the sum of the first accommodation portion depth H1 and a second accommodation portion depth H2 of the second accommodation portion 152*a*-2 may be the second thickness WD2 or more.

A bottom surface of the first accommodation portion 152*a*-1 may form a space by being separated from one surface or a surface of the second support frame 153.

The space may be a space in which a cleaning solution flows during cleaning of the mask assembly 150.

In the above case, the welding point WT may be disposed at the side surface of the second support frame 153.

For example, the welding point WT may be disposed at a boundary between the first accommodation portion 152*a*-1 and the second accommodation portion 152*a*-2, thereby fixing the second support frame 153 to the first support frame 152.

Figure 6B:
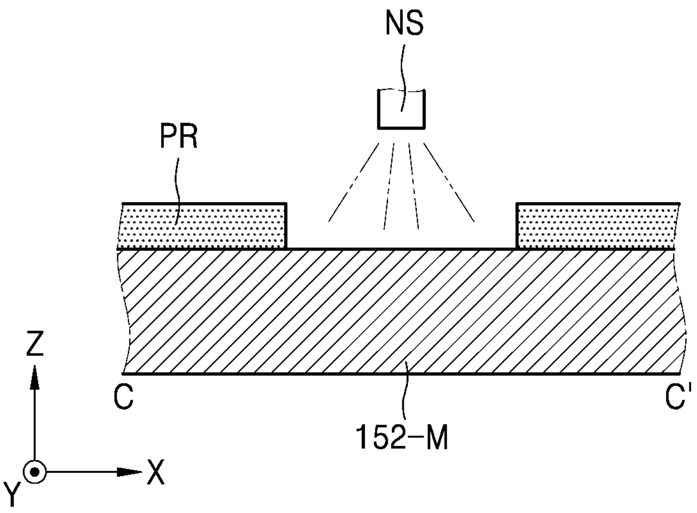
FIGS. 6B to 6D are schematic cross-sectional views showing a manufacturing process of forming the accommodation portion illustrated in FIG. 6A.
Figure 6C:
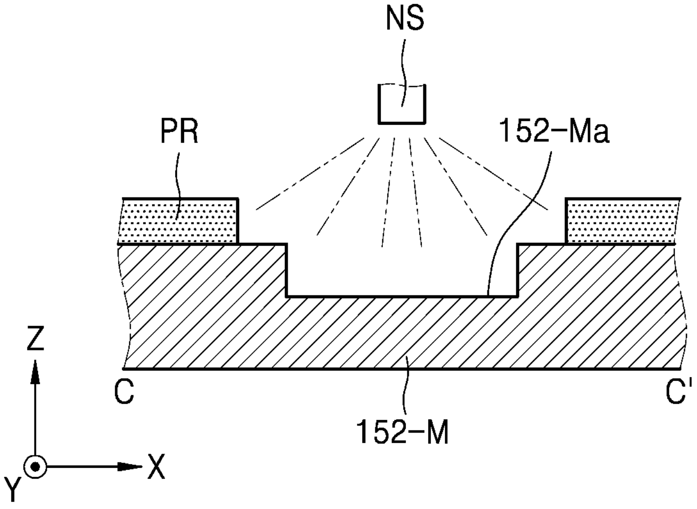
Figure 6D:
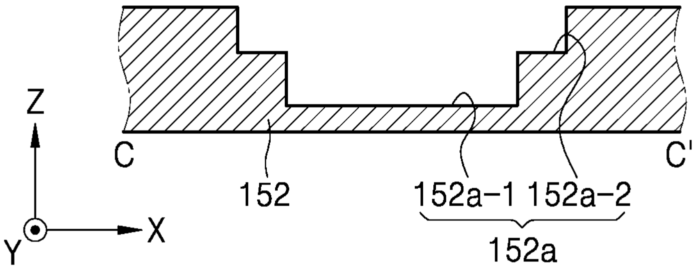

FIGS. 6B to 6D are schematic cross-sectional views showing a manufacturing process of forming the accommodation portion illustrated in FIG. 6A.

Line C-C' may denote a cross-sectional line for the same portion that is indicated by line C-C' of FIG. 2.

Referring to FIG. 6B, according to the method of forming the accommodation portion 152*a* in the first support frame 152, photoresist PR may be disposed on a first support frame base member 152-M.

The photoresist PR may be formed to be partially opened.

The first support frame base member 152-M may form one first support frame 152 or first support frames 152 (e.g., see FIG. 6A).

Referring to FIG. 6C, after a nozzle NS is disposed above an open portion of the photoresist PR, an etchant may be sprayed onto one surface or a surface of the first support frame base member 152-M.

As the etchant etches a portion of the first support frame base member 152-M exposed through the opening portion of the photoresist PR, an accommodation portion recess 152-Ma may be formed.

After removing the photoresist PR, the photoresist PR having a width greater than the accommodation portion recess 152-Ma may be disposed again on the first support frame base member 152-M.

The etchant may be sprayed, through the nozzle NS, onto the accommodation portion recess 152-Ma and one surface or a surface of the first support frame base member 152-M where the photoresist PR is not disposed.

Referring to FIG. 6D and in conjunction with FIG. 6C, in the above case, as the accommodation portion recess 152-Ma and one surface or a surface of the first support frame base member 152-M where the photoresist PR is not disposed are etched, the accommodation portion recess 152-Ma may become the first accommodation portion 152*a*-1, and one surface or a surface of the first support frame base member 152-M where the photoresist PR is not disposed may be etched to be the second accommodation portion 152*a*-2.

By cutting the first support frame base member 152-M manufactured as described above, first support frames 152 may be formed.

The first support frame base member 152-M may be formed as the first support frame 152 without being cut.

In the above case, the accommodation portion 152*a* may be formed by using laser, in addition to the etchant.

For example, by disposing a laser irradiation portion (not shown) at the position of the nozzle NS illustrated in FIGS. 6B and 6C, the first accommodation portion 152*a*-1 and the second accommodation portion 152*a*-2 may be formed through laser processing.

In case that the first accommodation portion 152*a*-1 and the second accommodation portion 152*a*-2 are formed by using laser, as illustrated in FIGS. 6B to 6D, after cutting a portion of the first support frame 152 where the first accommodation portion 152*a*-1 is to be formed, a portion of the first support frame 152 where the second accommodation portion 152*a*-2 is to be formed and a portion of the first support frame 152 where the first accommodation portion 152*a*-1 is to be formed are cut again, and thus, the first accommodation portion 152*a*-1 and the second accommodation portion 152*a*-2 may be formed.

In an embodiment, the first accommodation portion 152*a*-1 and the second accommodation portion 152*a*-2 may be simultaneously formed.

Figure 7:
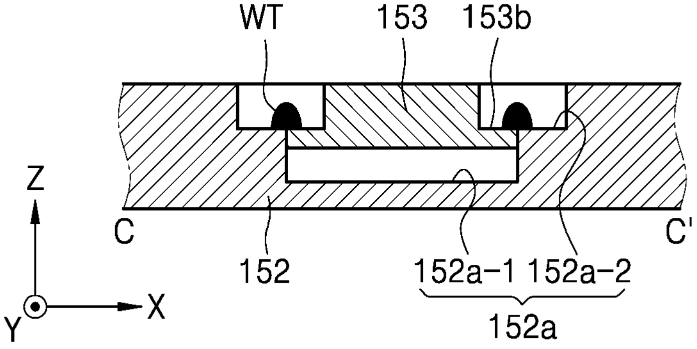
FIG. 7 is a schematic cross-sectional view of a portion of a mask assembly of an apparatus for manufacturing a display device, according to an embodiment.

FIG. 7 is a schematic cross-sectional view of a portion of a mask assembly of an apparatus for manufacturing a display device, according to an embodiment.

Referring to FIG. 7, an apparatus (not shown) for manufacturing a display device may include a chamber (not shown), a first support portion (not shown), a second support portion (not shown), the mask assembly 150 (e.g., see FIG. 2), a source unit (not shown), a magnetic force unit (not shown), a vision unit (not shown), and a pressure regulator (not shown).

As the chamber, the first support portion, the second support portion, the source unit, the magnetic force unit, the vision unit, and the pressure regulator are the same as or similar to those described in FIG. 1, detailed descriptions thereof are omitted.

The mask assembly 150 may include a mask frame (not shown), the first support frame 152, and the second support frame 153.

As the mask frame, the first support frame 152, and the second support frame 153 are similar to those illustrated in FIG. 2, detailed descriptions thereof are omitted.

While one of the first support frame 152 and the second support frame 153 may include the accommodation portion 152*a*, the other of the first support frame 152 and the second support frame 153 may be inserted into the accommodation portion 152*a*.

In the following description, for convenience of explanation, a case in which the first support frame 152 may include the accommodation portion 152*a* is described in detail.

The accommodation portion 152*a* may include the first accommodation portion 152*a*-1 and the second accommodation portion 152*a*-2 having different sizes.

As the first accommodation portion 152*a*-1 and the second accommodation portion 152*a*-2 are the same as or similar to those described in FIG. 6A, detailed descriptions thereof are omitted.

A part of the side surface of the second support frame 153 may be formed to have a step.

For example, the part of the side surface of the second support frame 153, which is inserted into the accommodation portion 152*a*, may be formed to have a step by partially removing the portion.

In the above case, as the stepped side surface 153*b* of the second support frame 153 and the inner surface of the second accommodation portion 152*a*-2 form a space, a space for forming the welding point WT may be provided.

In the above case, the upper surface of the first support frame 152 and the upper surface of the second support frame 153 may be disposed on a same plane.

As described above, the accommodation portion 152*a*, in which the part of the side surface of the second support frame 153 is formed to have a step, may be the same as that illustrated in FIG. 6A.

A welding recess (not shown) may not be disposed in the second support frame 153.

Figure 8:
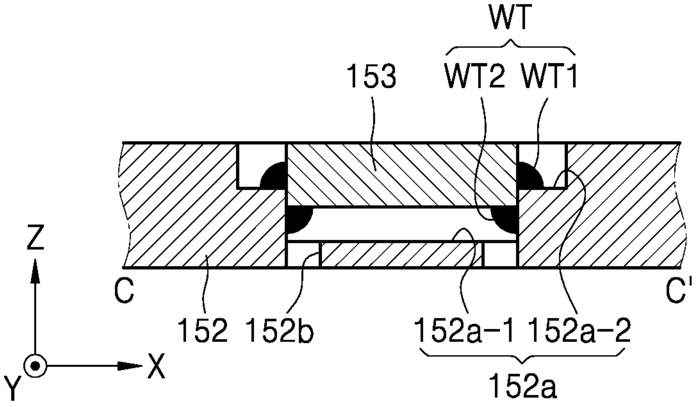
FIG. 8 is a schematic cross-sectional view of a portion of a mask assembly of an apparatus for manufacturing a display device, according to an embodiment.

FIG. 8 is a schematic cross-sectional view of a portion of a mask assembly of an apparatus for manufacturing a display device, according to an embodiment.

Referring to FIG. 8, an apparatus (not shown) for manufacturing a display device may include a chamber (not shown), a first support portion (not shown), a second support portion (not shown), the mask assembly 150 (e.g., see FIG.

2), a source unit (not shown), a magnetic force unit (not shown), a vision unit (not shown), and a pressure regulator (not shown).

As the chamber, the first support portion, the second support portion, the source unit, the magnetic force unit, the vision unit, and the pressure regulator are the same as or similar to those described in FIG. 1, detailed descriptions thereof are omitted.

The mask assembly 150 may include a mask frame (not shown), the first support frame 152, and the second support frame 153.

As the mask frame, the first support frame 152, and the second support frame 153 are similar to those illustrated in FIG. 2, detailed descriptions thereof are omitted.

While one of the first support frame 152 and the second support frame 153 may include the accommodation portion 152*a*, the other of the first support frame 152 and the second support frame 153 may be inserted into the accommodation portion 152*a*.

In the following description, for convenience of explanation, a case in which the first support frame 152 may include the accommodation portion 152*a* is described in detail.

The accommodation portion 152*a* may include the first accommodation portion 152*a*-1 and the second accommodation portion 152*a*-2 having different sizes.

The first accommodation portion 152*a*-1 and the second accommodation portion 152*a*-2 are the same as or similar to those described in FIG. 6A, detailed descriptions thereof are omitted.

The first support frame 152 may include a through-hole (or a through portion) 152*b* communicating with the accommodation portion 152*a*.

In case that the mask assembly 150 is cleaned by using a cleaning solution, the through-hole 152*b* may prevent the cleaning solution from remaining in the intersections where the first support frame 152 and the second support frame 153 intersect each other.

In other words, in case that the cleaning solution is introduced into the accommodation portion 152*a*, the cleaning solution may leak not only through a space between the bottom surface of the second accommodation portion 152*a*-2 and a rear surface of the second support frame 153, but also from the accommodation portion 152*a* through the through-hole 152*b*.

In the above case, the welding point WT may be formed on at least one of a lower end of the side surface of the second support frame 153 and an upper end of the side surface of the second support frame 153.

For example, the welding point WT may include a first welding point WT1 disposed on the upper end of the side surface of the second support frame 153 and a second welding point WT2 disposed on the lower end of the side surface of the second support frame 153.

Accordingly, the second support frame 153 may be firmly fixed to the first support frame 152.

Figure 9:
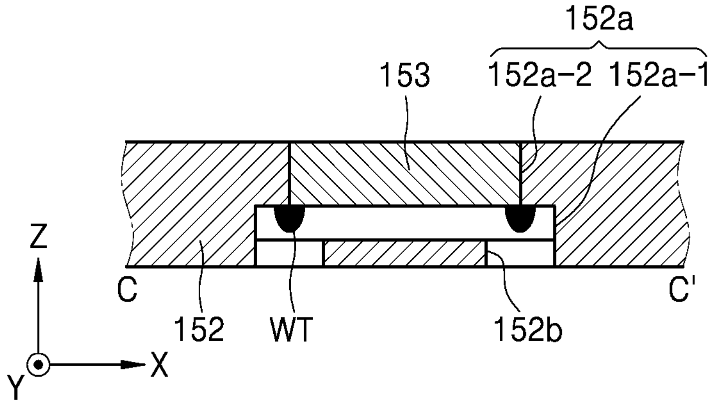
FIG. 9 is a schematic cross-sectional view of a portion of a mask assembly of an apparatus for manufacturing a display device, according to an embodiment.

FIG. 9 is a schematic cross-sectional view of a portion of a mask assembly of an apparatus for manufacturing a display device, according to an embodiment.

Referring to FIG. 9, an apparatus (not shown) for manufacturing a display device may include a chamber (not shown), a first support portion (not shown), a second support portion (not shown), the mask assembly 150 (e.g., see FIG. 2), a source unit (not shown), a magnetic force unit (not shown), a vision unit (not shown), and a pressure regulator (not shown).

As the chamber, the first support portion, the second support portion, the source unit, the magnetic force unit, the vision unit, and the pressure regulator are the same as or similar to those described in FIG. 1, detailed descriptions thereof are omitted.

The mask assembly 150 may include a mask frame (not shown), the first support frame 152, and the second support frame 153.

As the mask frame, the first support frame 152, and the second support frame 153 are similar to those illustrated in FIG. 2, detailed descriptions thereof are omitted.

While one of the first support frame 152 and the second support frame 153 may include the accommodation portion 152*a*, the other of the first support frame 152 and the second support frame 153 may be inserted into the accommodation portion 152*a*.

In the following description, for convenience of explanation, a case in which the first support frame 152 may include the accommodation portion 152*a* is described in detail.

The accommodation portion 152*a* may include the first accommodation portion 152*a*-1 and the second accommodation portion 152*a*-2.

The first accommodation portion 152*a*-1 and the second accommodation portion 152*a*-2 may have different widths and may be connected to each other. For example, the width of the first accommodation portion 152*a*-1 measured in one direction or a direction may be more than the width of the second accommodation portion 152*a*-2. The width of the second accommodation portion 152*a*-2 measured in one direction or a direction may be less than the width of the first accommodation portion 152*a*-1.

The rear surface of the second support frame 153 and the bottom surface of the second accommodation portion 152*a*-2 may be separated from each other.

In an embodiment, although not illustrated, the accommodation portion 152*a* may be the same as that illustrated in FIG. 5.

In an embodiment, although not illustrated, the accommodation portion 152*a* may be the same as or similar to that illustrated in FIG. 6A, 7, or 8.

Furthermore, although the second support frame 153 may be the same as or similar to that illustrated in FIG. 6A or 8, the second support frame 153 may have a shape similar to that illustrated in FIG. 7.

In the above case, the accommodation portion 152*a* may be connected to the through-hole 152*b*.

The through-hole 152*b* may be formed in the rear surface of the first support frame 152.

The welding point WT may be formed to connect the second support frame 153 and the inner surface of the accommodation portion 152*a* to each other.

As the welding point WT is not disposed on the upper surface of the first support frame 152 and the upper surface of the second support frame 153 facing a display substrate (not shown), the display substrate may be completely in close contact with the upper surface of the first support frame 152 and the upper surface of the second support frame 153.

Figure 10:
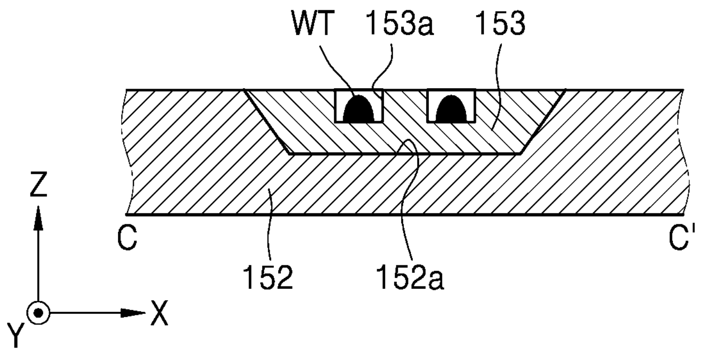
FIG. 10 is a schematic cross-sectional view of a portion of a mask assembly of an apparatus for manufacturing a display device, according to an embodiment.

FIG. 10 is a schematic cross-sectional view of a portion of a mask assembly of an apparatus for manufacturing a display device, according to an embodiment.

Referring to FIG. 10, an apparatus (not shown) for manufacturing a display device may include a chamber (not shown), a first support portion (not shown), a second support portion (not shown), the mask assembly 150 (e.g., see FIG. 2), a source unit (not shown), a magnetic force unit (not shown), a vision unit (not shown), and a pressure regulator (not shown).

As the chamber, the first support portion, the second support portion, the source unit, the magnetic force unit, the vision unit, and the pressure regulator are the same as or similar to those described in FIG. 1, detailed descriptions thereof are omitted.

The mask assembly 150 may include a mask frame (not shown), the first support frame 152, and the second support frame 153.

As the mask frame, the first support frame 152, and the second support frame 153 are similar to those illustrated in FIG. 2, detailed descriptions thereof are omitted.

While one of the first support frame 152 and the second support frame 153 may include the accommodation portion 152*a*, the other of the first support frame 152 and the second support frame 153 may be inserted into the accommodation portion 152*a*.

In the following description, for convenience of explanation, a case in which the first support frame 152 may include the accommodation portion 152*a* is described in detail.

The accommodation portion 152*a* may be the same as or similar to one of those illustrated in FIGS. 5, 6A, and 7 to 9.

In the following description, for convenience of explanation, a case in which the accommodation portion 152*a* is the same as that illustrated in FIG. 5 is described in detail.

Furthermore, the second support frame 153 may be similar to one of those illustrated in FIGS. 5, 6A, and 7 to 9.

In the above case, a first cross-section of the first support frame 152 perpendicular to the longitudinal direction of the first support frame 152 and a second cross-section of the second support frame 153 perpendicular to the longitudinal direction of the second support frame 153 may have a trapezoidal shape.

In the following description, for convenience of explanation, a case in which both the first cross-section and the second cross-section have a trapezoidal shape is described in detail.

As the first cross-section and the second cross-section have a similar shape, the shape of the cross-section of the second support frame 153 perpendicular to the longitudinal direction of the second support frame 153 is described in detail.

The second cross-section may have a trapezoidal shape.

For example, the second cross-section is measured in the first direction, and the width of an upper surface portion of the second support frame 153 facing the display substrate (not shown) may be greater than the width of a lower surface portion of the second support frame 153.

The second support frame 153 may not block a path through which a deposition material moves (or may not block the movement path of a deposition material).

Although not illustrated, the first support frame 152 may have a trapezoidal shape similar to the second support frame 153.

The side surface of the first support frame 152 disposed in a Y-axis direction of FIG. 10 may be inclined.

Furthermore, the width of an upper portion of the first cross-section facing the display substrate may be greater than the width of a lower portion of the first cross-section.

Accordingly, the first support frame 152 may not block the movement path of a deposition material.

In the above case, the welding recess 153*a* may be disposed in the second support frame 153.

As the welding point WT is disposed in the welding recess 153*a*, the display substrate and the upper surface of the second support frame 153 may be completely in close contact with each other.

Although not illustrated, the accommodation portion 152*a* and a side surface portion of the second support frame 153 may each have a shape similar to one of those illustrated in FIGS. 7 to 9.

A through-hole (not shown) may be connected to the accommodation portion 152*a*.

Furthermore, in case that the side surface portion of the second support frame 153 has a stepped portion, the upper portion of the second cross-section in the trapezoidal shape may have a stepped portion, and the second cross-section may have a shape in which an upper corner portion in the trapezoidal shape is removed.

Accordingly, the apparatus for manufacturing a display device may prevent the display substrate from being damaged by the mask assembly 150 during the deposition of a deposition material on the display substrate.

FIG. 11 is a schematic plan view of a display device according to one or more embodiments.

Figure 12:
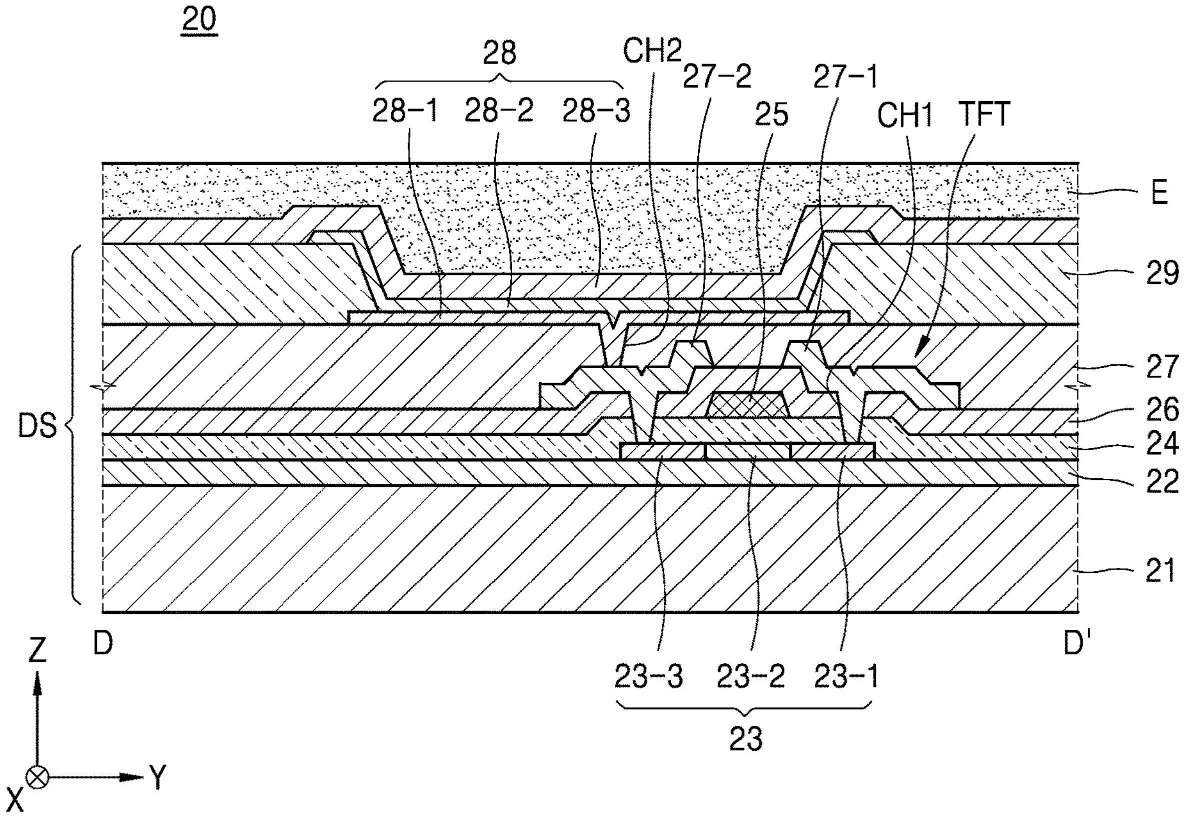
FIG. 12 is a schematic cross-sectional view of a display device taken along line D-D' of FIG. 11.

FIG. 12 is a schematic cross-sectional view of a display device taken along line D-D' of FIG. 11.

Referring to FIGS. 11 and 12, the display device 20 may define, on a substrate 21, a display area DA and a non-display area NDA outside the display area DA.

An organic light-emitting diode (OLED) 28 is disposed in the display area DA, and a power wiring (not shown) and the like may be disposed in the non-display area NDA.

Furthermore, a pad portion CD may be disposed in the non-display area NDA.

The deposition material having passed through the deposition area (not shown) may be disposed in the display area DA.

The display area DA may have a rectangular shape.

In an embodiment, the display area DA is not limited thereto, and may have other polygonal shapes.

The display device 20 may include the display substrate DS.

The display substrate DS may mean a member from the substrate 21 to a layer disposed below a common layer.

In the following description, for convenience of explanation, a case in which the display substrate DS means a member from the substrate 21 to an intermediate layer 28-2 is described in detail.

The display device 20 may include a counter electrode 28-3 disposed on the display substrate DS.

Furthermore, the display device 20 may include a thin film encapsulation layer E formed above the counter electrode 28-3.

The display substrate DS may include the substrate 21, a thin film transistor TFT, a passivation film 27, a pixel electrode 28-1, the intermediate layer 28-2, and a pixel defining layer 29.

The substrate 21 may use a plastic material, and may use a metal material, such as stainless steel (SUS), T1, and the like within the spirit and the scope of the disclosure.

Furthermore, the substrate 21 may use polyimide (PI).

In the following description, for convenience of explanation, a case in which the substrate 21 is formed of polyimide is described in detail.

The thin film transistor TFT may be formed on the substrate 21, the passivation film 27 may be formed to cover the thin film transistor TFT, and the OLED 28 may be formed on the passivation film 27.

A buffer layer 22 formed of an organic compound and/or an inorganic compound may be further formed on an upper surface of the substrate 21, and may be formed of $SiO_x$ ($x \geq 1$), $SiN_x$ ($x \geq 1$), or the like within the spirit and the scope of the disclosure.

After an active layer 23 arranged or disposed in a given pattern is formed on the buffer layer 22, the active layer 23 is covered by a gate insulating layer 24.

The active layer 23 may have a source region 23-1 and a drain region 23-3, and may further have a channel region 23-2 therebetween.

The active layer 23 may be formed to contain various materials.

For example, the active layer 23 may contain an inorganic semiconductor material such as amorphous silicon or crystalline silicon.

In another example, the active layer 23 may contain an oxide semiconductor material.

In another example, the active layer 23 may contain an organic semiconductor material.

However, in the following description, for convenience of explanation, a case in which the active layer 23 is formed of polycrystalline silicon is described in detail.

After an amorphous silicon film is formed on the buffer layer 22, the active layer 23 may be formed by crystalizing the amorphous silicon film to form a polycrystalline silicon film, and patterning the polycrystalline silicon film.

The source region 23-1 and the drain region 23-3 of the active layer 23 may be doped with impurities according to the type of the thin film transistor TFT, such as a driving thin film transistor (not shown), a switching thin film transistor (not shown), and the like within the spirit and the scope of the disclosure.

A gate electrode 25 corresponding to the active layer 23 and an interlayer insulating layer 26 that covers the gate electrode 25 are formed on an upper surface of the gate insulating layer 24.

After forming a contact hole CH1 between the interlayer insulating layer 26 and the gate insulating layer 24, a source electrode 27-1 and a drain electrode 27-2 are formed on the interlayer insulating layer 26 to be in contact with the source region 23-1 and the drain region 23-3, respectively.

The passivation film 27 is formed above the thin film transistor TFT formed as described above, and the pixel electrode 28-1 of the OLED 28 is formed above the passivation film 27.

The pixel electrode 28-1 is in contact with the drain electrode 27-2 of the thin film transistor TFT via a via hole CH2 formed in the passivation film 27.

The passivation film 27 may include an inorganic material and/or an organic material, and may be formed in a single layer or two or more layers. While the passivation film 27 may be formed as a planarized film such that an upper surface thereof is planarized regardless of the curvature of an underlayer thereof, the passivation film 27 may be formed to be curved according to the curvature of the underlayer.

The passivation film 27 may be formed as a transparent insulator to achieve a resonance effect.

After forming the pixel electrode 28-1 on the passivation film 27, to cover the pixel electrode 28-1 and the passivation film 27, the pixel defining layer 29 is formed of an organic material and/or an inorganic material and opened to expose the pixel electrode 28-1.

The intermediate layer 28-2 and the counter electrode 28-3 are formed on at least the pixel electrode 28-1.

In an embodiment, the counter electrode 28-3 may be formed on the entire surface of the display substrate DS.

The counter electrode 28-3 may be formed on (or above) the intermediate layer 28-2 and the pixel defining layer 29.

In the following description, for convenience of explanation, a case in which the counter electrode 28-3 is formed above the intermediate layer 28-2 and the pixel defining layer 29 is described in detail.

While the pixel electrode 28-1 functions as an anode electrode, the counter electrode 28-3 functions as a cathode electrode. The polarities of the pixel electrode 28-1 and the counter electrode 28-3 may be reversed.

The pixel electrode 28-1 and the counter electrode 28-3 are insulated from each other by the intermediate layer 28-2, and by applying voltages of different polarities to the pixel electrode 28-1 and the counter electrode 28-3, light emission is made in an organic emission layer.

The intermediate layer 28-2 may include the organic emission layer.

In another example, the intermediate layer 28-2 may include an organic emission layer, and further include at least one of a hole injection layer (HIL), a hole transport layer, an electron transport layer, and an electron injection layer.

An embodiment is not limited thereto, and the intermediate layer 28-2 may include an organic emission layer, and may further include various other functional layers (not shown).

The common layer that is disposed entirely in the display area DA as described above may be formed through the apparatus (not shown) for manufacturing a display device described above.

For example, the common layer may include at least one of the counter electrode 28-3, the organic emission layer of the intermediate layer 28-2, the HIL of the intermediate layer 28-2, the hole transport layer of the intermediate layer 28-2, the electron transport layer of the intermediate layer 28-2, the electron injection layer of the intermediate layer 28-2, and a capping layer (not shown) to be described below.

The organic emission layer of the intermediate layer 28-2 as described above may include organic emission layers, and the organic emission layers of the intermediate layer 28-2 may form the display area DA.

The organic emission layers of the intermediate layer 28-2 may be arranged or disposed to be spaced apart from each other in the display area DA.

Some or a number of the organic emission layers of the intermediate layer 28-2, and some or a number of other of the organic emission layers of the intermediate layer 28-2 may include materials for emitting light of different colors.

In an embodiment, the organic emission layer of the intermediate layer 28-2 may be arranged or disposed integrally over the entire area of the display area DA.

The organic emission layer of the intermediate layer 28-2 may be the layer including materials emitting light of different colors.

One unit pixel may include sub-pixels, and the sub-pixels may emit light of various colors.

For example, the sub-pixels may include sub-pixels for respectively emitting red, green, and blue light, or sub-pixels (not shown) for respectively emitting red, green, blue, and white light.

The organic emission layer arranged or disposed to correspond to each sub-pixel may include a material that emit light of a different color.

Furthermore, one unit sub-pixel may include sub-pixels emitting light of a same color.

There may be organic emission layers corresponding to the respective sub-pixels, each organic emission layer may include a material that emits light of a different color, and organic emission layers arranged or disposed in one sub-pixel may be deposited.

The thin film encapsulation layer E as described above may include inorganic layers, or an inorganic layer and an organic layer.

The organic layer of the thin film encapsulation layer E may be a single film or deposition film including any one polymer of for example, polyethylene terephthalate, polyimide, polycarbonate, epoxy, polyethylene, and polyacrylate.

By way of example, the organic layer may include polyacrylate, and in detail may include a polymerized monomer composition including a diacrylate-based monomer and a triacrylate-based monomer.

The monomer composition may further include a monoacrylate-based monomer.

Furthermore, the monomer composition may further include a photoinitiator such as thermoplastic olefin (TPO), but the disclosure is not limited thereto.

The inorganic layer of the thin film encapsulation layer E may be a single film or deposition film including a metal oxide or a metal nitride.

In detail, the inorganic layer may include any one of $SiN_x$, $Al_2O_3$, $SiO_2$, and $TiO_2$.

A top layer exposed to the outside of the thin film encapsulation layer E may be formed of an inorganic layer to prevent infiltration of moisture into the OLED 28.

The thin film encapsulation layer E may have at least one sandwich structure in which at least one organic layer is inserted between at least two inorganic layers.

In another example, the thin film encapsulation layer E may have at least one sandwich structure in which at least one inorganic layer is inserted between at least two organic layers.

In another example, the thin film encapsulation layer E may have a sandwich structure in which at least one organic layer is inserted between at least two inorganic layers and a sandwich structure in which at least one inorganic layer is inserted between at least two organic layers.

The thin film encapsulation layer E may include a first inorganic layer, a first organic layer, and a second inorganic layer, sequentially upwards from the OLED 28.

In another example, the thin film encapsulation layer E may include a first inorganic layer, a first organic layer, a second inorganic layer, a second organic layer, and a third inorganic layer, sequentially upwards from the OLED 28.

In another example, the thin film encapsulation layer E may include a first inorganic layer, a first organic layer, a second inorganic layer, a second organic layer, a third inorganic layer, a third organic layer, and a fourth inorganic layer, sequentially upwards from the OLED 28.

A halogenated metal layer including LiF that is a capping layer may be further included between the OLED 28 and a first inorganic layer.

The halogenated metal layer may prevent the OLED 28 from being damaged in case that the first inorganic layer is formed by a sputtering method.

The first organic layer may have an area narrower than the second inorganic layer, and the second organic layer may have an area narrower than the third inorganic layer.

In relation with the above, the display device 20 may not include the thin film encapsulation layer E, and may include an encapsulation substrate (not shown) connected to the substrate 21.

A sealing portion is disposed between the substrate 21 and the encapsulation substrate, thereby isolating the OLED 28 from the outside.

Accordingly, the display device 20 may implement a display area that is the same as or similar to a designed display area.

According to the apparatus and method of manufacturing a display device according to one or more embodiments, the common layer may be precisely deposited on the display area.

According to the apparatus and method of manufacturing a display device according to one or more embodiments, during the manufacturing of a display device, damage to the display device may be reduced.

It should be understood that embodiments described herein should be considered in a descriptive sense only and not for purposes of limitation.

Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope and as defined by the attached claims.

What is claimed is:

1. An apparatus for manufacturing a display device, the apparatus comprising:
- a deposition source; and
- a mask assembly disposed between a substrate and the deposition source, wherein
- the mask assembly comprises:
  - a mask frame having an opening area;
  - a first support frame disposed across the opening area in a first direction, and having both ends disposed on the mask frame; and
  - a second support frame disposed across the opening area in a second direction, and having both ends disposed on the mask frame,
- the first support frame and the second support frame intersect each other,
- one of the first support frame and the second support frame comprises an accommodation portion,
- the other of the first support frame and the second support frame is inserted into the accommodation portion, and
- the accommodation portion comprises:
  - a first accommodation portion; and
  - a second accommodation portion disposed below the first accommodation portion, and having a width less than a width of the first accommodation portion.

2. The apparatus of claim 1, wherein a surface of the first support frame and a surface of the second support frame, both facing the substrate, are disposed on a flat surface.

3. The apparatus of claim 1, wherein the other of the first support frame and the second support frame inserted into the accommodation portion comprises a welding recess.

4. The apparatus of claim 1, wherein the other of the first support frame and the second support frame inserted into the accommodation portion is attached to the one of the first support frame and the second support frame between the first accommodation portion and the second accommodation portion.

5. The apparatus of claim 1, wherein a side surface of the other of the first support frame and the second support frame inserted into the accommodation portion has a substantially step shape.

6. The apparatus of claim 1, wherein an upper surface of the mask frame has a substantially step shape.

7. A method of manufacturing the display device using the apparatus of claim 1, the method comprising:

disposing the substrate and the mask assembly; and
depositing a deposition material on the substrate by passing the deposition material through the mask assembly.

8. The method of claim 7, wherein a surface of the first support frame and a surface of the second support frame, both facing the substrate, are disposed on a flat surface.

9. The method of claim 7, wherein the other of the first support frame and the second support frame inserted into the accommodation portion comprises a welding recess.

10. The method of claim 7, wherein the other of the first support frame and the second support frame inserted into the accommodation portion is attached to the one of the first support frame and the second support frame between the first accommodation portion and the second accommodation portion.

11. The method of claim 7, wherein a side surface of the other of the first support frame and the second support frame inserted into the accommodation portion has a substantially step shape.

12. The method of claim 7, wherein an upper surface of the mask frame has a substantially step shape.

13. An apparatus for manufacturing a display device, the apparatus comprising:
a deposition source; and
a mask assembly disposed between a substrate and the deposition source, wherein
the mask assembly comprises:
a mask frame having an opening area;
a first support frame disposed across the opening area in a first direction, and having both ends disposed on the mask frame; and
a second support frame disposed across the opening area in a second direction, and having both ends disposed on the mask frame,
the first support frame and the second support frame intersect each other,
one of the first support frame and the second support frame comprises an accommodation portion,
the other of the first support frame and the second support frame is inserted into the accommodation portion, and
one of the first support frame and the second support frame comprises a through portion disposed in the one of the first support frame and the second support frame to be connected to the accommodation portion.

14. The apparatus of claim 13, wherein a welding point for attaching the first support frame and the second support frame is disposed in the through portion.

15. A method of manufacturing the display device using the apparatus of claim 7, the method comprising:
disposing the substrate and the mask assembly; and
depositing a deposition material on the substrate by passing the deposition material through the mask assembly.

16. The method of claim 15, wherein a welding point for attaching the first support frame and the second support frame is disposed in the through portion.

17. An apparatus for manufacturing a display device, the apparatus comprising:
a deposition source; and
a mask assembly disposed between a substrate and the deposition source, wherein
the mask assembly comprises:
a mask frame having an opening area;
a first support frame disposed across the opening area in a first direction, and having both ends disposed on the mask frame; and
a second support frame disposed across the opening area in a second direction, and having both ends disposed on the mask frame,
the first support frame and the second support frame intersect each other,
one of the first support frame and the second support frame comprises an accommodation portion,
the other of the first support frame and the second support frame is inserted into the accommodation portion,
a cross-section of at least one of the first support frame and the second support frame has a substantially trapezoidal shape, and
the cross-section of the at least one of the first support frame and the second support frame is perpendicular to a longitudinal direction.

18. A method of manufacturing the display device using the apparatus of claim 7, the method comprising:
disposing the substrate and the mask assembly; and
depositing a deposition material on the substrate by passing the deposition material through the mask assembly.

* * * * *